(12) United States Patent
Kim

(10) Patent No.: US 10,736,217 B2
(45) Date of Patent: Aug. 4, 2020

(54) SURFACE MOUNTED DEVICE MODULE

(71) Applicant: LG INNOTEK CO., LTD., Seoul (KR)

(72) Inventor: Dong Woo Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 318 days.

(21) Appl. No.: 15/737,677

(22) PCT Filed: Jun. 15, 2016

(86) PCT No.: PCT/KR2016/006337
§ 371 (c)(1),
(2) Date: Dec. 18, 2017

(87) PCT Pub. No.: WO2016/204504
PCT Pub. Date: Dec. 22, 2016

(65) Prior Publication Data
US 2018/0199437 A1 Jul. 12, 2018

(30) Foreign Application Priority Data
Jun. 19, 2015 (KR) .......................... 10-2015-0087664

(51) Int. Cl.
H05K 1/11 (2006.01)
H05K 3/40 (2006.01)
(Continued)

(52) U.S. Cl.
CPC .............. *H05K 1/113* (2013.01); *H03H 7/38* (2013.01); *H05K 3/403* (2013.01); *H05K 1/0251* (2013.01); *H05K 1/0298* (2013.01); *H05K 3/0052* (2013.01); *H05K 3/429* (2013.01); *H05K 2201/095* (2013.01); *H05K 2201/10098* (2013.01)

(58) Field of Classification Search
CPC ........ H05K 1/113; H05K 3/403; H05K 3/429; H05K 1/0251; H05K 2201/095; H05K 1/0298
See application file for complete search history.

(56) References Cited

U.S. PATENT DOCUMENTS

2007/0279879 A1* 12/2007 Fujii ................. H01L 23/49805
361/760

FOREIGN PATENT DOCUMENTS

JP 2006-005052 1/2006
JP 2006-211070 8/2006
(Continued)

OTHER PUBLICATIONS

Machine Tranlslation of KR 10-2005-0072881.*
(Continued)

*Primary Examiner* — Julia Slutsker
(74) *Attorney, Agent, or Firm* — KED & Associates LLP

(57) ABSTRACT

A surface mounting component module according to one embodiment of the present invention comprises: a multi-layer substrate; a side via formed by penetrating the multi-layer substrate, and electrically connecting the multi-layer substrate; a side via pad positioned on at least one layer of the multi-layer substrate, and formed in the vicinity of the side via; and an RF pattern connected to the side via pad by a signal line, wherein all of the RF pattern, the side via, and the side via pad are electrically connected.

12 Claims, 13 Drawing Sheets

(51) Int. Cl.
*H03H 7/38* (2006.01)
*H05K 1/02* (2006.01)
*H05K 3/42* (2006.01)
*H05K 3/00* (2006.01)

(56) References Cited

FOREIGN PATENT DOCUMENTS

| | | |
|---|---|---|
| KR | 10-2005-0072881 | 7/2005 |
| KR | 10-0739151 | 7/2007 |
| KR | 10-0910225 | 7/2009 |
| KR | 10-1236796 | 2/2013 |
| KR | 10-2014-7034071 | 4/2013 |
| KR | 10-2014-0045030 | 4/2014 |
| KR | 10-2015-0011371 | 1/2015 |
| WO | WO 2013/099286 | 7/2013 |

OTHER PUBLICATIONS

International Search Report (with English Translation) and Written Opinion dated Sep. 12, 2016 issued in Application No. PCT/KR2016/006337.
Korean Office Action dated Apr. 3, 2017 issued in Application No. 10-2015-0087664.

\* cited by examiner

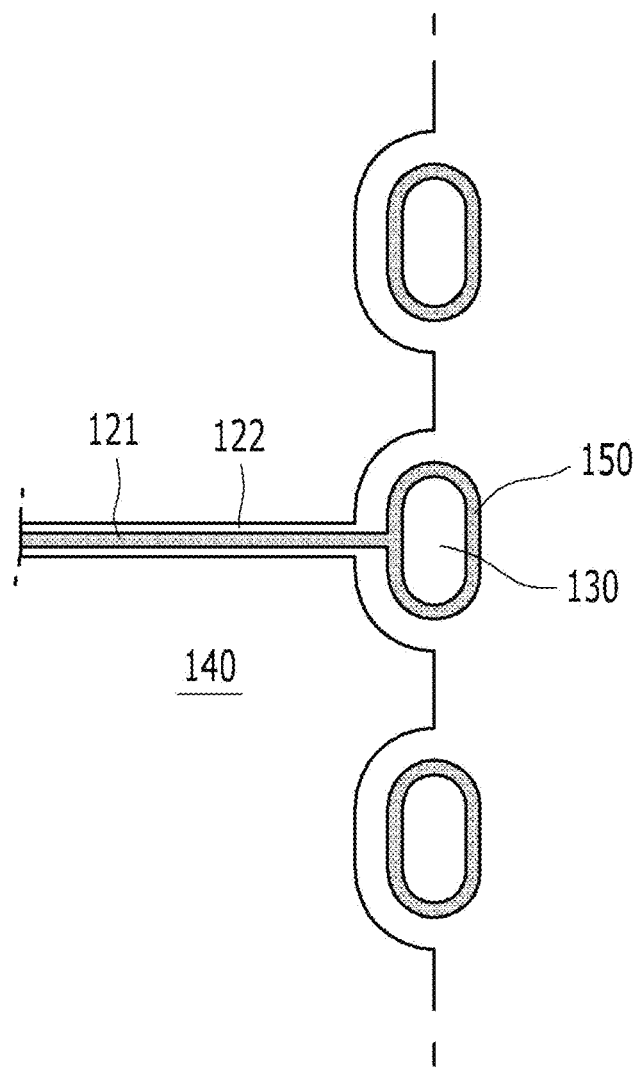

SURFACE MOUNTED DEVICE MODULE

CROSS-REFERENCE TO RELATED PATENT APPLICATIONS

This application is a U.S. National Stage Application under 35 U.S.C. § 371 of PCT Application No. PCT/KR2016/006337, filed Jun. 15, 2016, which claims priority to Korean Patent Application No. 10-2015-0087664, filed Jun. 19, 2015, whose entire disclosures are hereby incorporated by reference.

TECHNICAL FIELD

The present invention relates to a surface mounted device module including: a multi-layer substrate; a side via formed to penetrate the multi-layer substrate and electrically connect the multi-layer substrate; a side via pad positioned on at least any one layer of the multi-layer substrate and formed around the side via; and an RF pattern connected to the side via pad by a signal line, in which all of the RF pattern, the side via, and the side via pad are electrically connected.

BACKGROUND ART

The recent trend of miniaturizing electrical and electronic products in accordance with rapid advancement in techniques induces high integration and microminiaturization of the electronic products. Owing to such a trend, studies on surface mounting technology (SMT) for mounting highly integrated and miniaturized surface mounted devices (SMD) on a printed circuit board (PCB) are accelerated. The surface mounted device (SMD) refers to an element directly attached and soldered to a pattern without drilling a hole on the PCB or a ceramic substrate, and the SMD includes a chip resistor, a chip capacitor, a chip transistor and the like.

One of the technical requirements related to light, thin, short and small electronic products is mounting chips or wires in a small area at a high density. To satisfy such a requirement, multi-layer packages of packaging semiconductor chips and wires in a multi-layer structure have been proposed. Such a multi-layer package forms a plurality of via holes on at least one upper layer stacked on a base layer, fills a conductive material into the via holes, and electrically connects the conductive material to signal lines formed on the top and bottom using a solder, a stud or the like. A conventional via hole is formed in the shape of a hole having the same inner diameter.

However, after the via holes are formed in the outer periphery of a PCB substrate, a routing process of cutting the outer periphery is performed to form the PCB substrate in the shape of a product size, and a bur phenomenon of uncleanly cutting and drooping the PCB substrate and a number of plating defects occur on the surface of the via holes in the routing process.

DISCLOSURE OF INVENTION

Technical Problem

An object of the present invention is to minimize signal loss generated when different substrates are bonded.

An object of the present invention is to improve mass productivity according to the design of a side via.

An object of the present invention is to optimize RF matching according to the design of the RF pattern of a surface mounted device module.

An object of the present invention is to reduce the bur and the plating defects by configuring the via hole formed in the outer periphery of the substrate as a long hole having different horizontal and vertical diameters and positioning the center of the long hole in the outer periphery when the surface mounted device module is manufactured.

Technical Solution

To accomplish the above objects, according to one aspect of the present invention, there is provided a surface mounted device module including: a multi-layer substrate; a side via formed to penetrate the multi-layer substrate and electrically connect the multi-layer substrate; a side via pad positioned on at least any one layer of the multi-layer substrate and formed around the side via; and an RF pattern connected to the side via pad by a signal line, in which all of the RF pattern, the side via, and the side via pad are electrically connected.

At this point, in the surface mounted device module according to an embodiment of the present invention, the side via pad is formed around the side via to be spaced by a predetermined distance in correspondence to the shape of the side via.

In addition, in the surface mounted device module according to an embodiment of the present invention, the side via is exposed to the outer periphery of the surface mounted device module in at least any one of shapes including a semicircle, a semi-ellipse, a square, a rectangle and a trapezoid.

In addition, in the surface mounted device module according to an embodiment of the present invention, the side via is exposed to the outer periphery of the surface mounted device module in a concave shape, and the concave shape of the side via includes a curved line or at least one of two or more segments including one or more angles.

In addition, in the surface mounted device module according to an embodiment of the present invention, the side via pad is electrically connected to at least any one layer of the multi-layer substrate through a side via connected to the top layer and the bottom layer of the multi-layer substrate in a straight line.

In addition, the surface mounted device module according to an embodiment of the present invention may further include a ground formed around the side via and the side via pad to perform a ground function.

In addition, in the surface mounted device module according to an embodiment of the present invention, the RF pattern is formed of an RF line and an open area other than the RF line, and the open area is formed outside the side via pad. At this point, the open area is formed outside the side via pad to be spaced by a predetermined distance in correspondence to the shape of the side via pad.

At this point, in the surface mounted device module according to an embodiment of the present invention, the open area is formed to space the ground from the RF line as much as the first distance d1 for impedance matching of the RF pattern and to space the ground from the side via pad as much as the second distance d2 for impedance matching of the RF pattern, and the second distance d2 is larger than the first distance d1. In addition, the open area is formed in an area corresponding to an area between the side via pad and the ground spaced apart from each other as much as the second distance d2.

In addition, in the surface mounted device module according to an embodiment of the present invention, the second distance d2 is a distance corresponding to a value determined based on at least any one of a semicircle, a semi-ellipse, a square, a rectangle and a trapezoid, and an area formed around the side via pad in the open area is formed on the top layer and the bottom layer of the multi-layer substrate.

In addition, in the surface mounted device module according to an embodiment of the present invention, the side via is exposed to the outer periphery of the surface mounted device module in a concave shape, and the second distance d2 is a distance determined based on the concave shape.

In addition, in the surface mounted device module according to an embodiment of the present invention, the second distance d2 is determined by the impedance Z_RF_line associated with the RF line, the impedance Z_side via of the side via, the thickness H of the substrate, the permittivity Er of the multi-layer substrate, the diameter D_c of an inscribed circle of a shape including at least any one of a semicircle, a square and a trapezoid, and the diameter D_p of the side via pad.

In addition, in the surface mounted device module according to an embodiment of the present invention, the second distance d2 is determined by the impedance Z_RF_line associated with the RF line, the impedance Z_side_via of the side via, the thickness H of the substrate, the permittivity Er of the multi-layer substrate, the length D_c of a minor axis when the side via is in the shape of a semi-ellipse or a rectangle, and the diameter D_p of the side via pad.

In addition, in the surface mounted device module according to an embodiment of the present invention, the second distance d2 is determined by the impedance Z_RF_line associated with the RF line, the impedance Z_side_via of the side via, the thickness H of the substrate, the permittivity Er of the multi-layer substrate, the depth D_c of a concave shape in case of a side via of a concave shape, and the diameter D_p of the side via pad.

At this point, in the surface mounted device module according to an embodiment of the present invention, the impedance Z_RF_line associated with the RF line and the impedance Z_side_via of the side via satisfy a condition of having an approximate value, and the impedance Z_side_via of the side via is determined by a formula shown below.

$$L = \frac{H}{5}\left[\ln\left(\frac{4H}{D\_c}\right) + 1\right]$$

$$Z_{side\_via} = \sqrt{\frac{L}{C}}$$

$$C = \frac{0.055 \times E_r \times H \times D\_p}{2 \times d_2}$$

Advantageous Effects

The present invention has an effect of minimizing signal loss generated when different substrates are bonded.

The present invention has an effect of improving mass productivity according to the design of a side via.

The present invention has an effect of optimizing RF matching according to the design of the RF pattern of a surface mounted device module.

Since the diameter of a hole itself is reduced by configuring the via hole formed in the outer periphery of the substrate as a long hole having different horizontal and vertical diameters and positioning the center of the long hole in the outer periphery when the surface mounted device module is manufactured, the present invention has an effect of reducing the bur and the plating defects when an outer periphery process (a routing process or the like) is performed on the substrate.

When a surface mounted device module is manufactured, the present invention calculates, after forming a side via hole, a distance between the via pad and the ground by applying a preset formula to unknowns such as thickness of the substrate, diameter of the via hole, diameter of the via pad, permittivity, matching impedance and the like, and makes impedance matching possible in itself by removing the ground according to the distance.

In addition, impedance change occurs since several substrates from the first layer to the sixth or higher layer of the multi-layer substrate give effect to the impedance as a side via hole is formed, and the present invention has an effect of reducing loss when a signal is transferred since the impedance matching is progressed by removing part of the ground from the surface mounted device module.

BRIEF DESCRIPTION OF THE DRAWINGS

FIGS. 5A to 5D are exemplary views showing various forms of implementing a side via hole formed in a surface mounted device module of the present invention.

DESCRIPTION OF SYMBOLS

Figure 1:
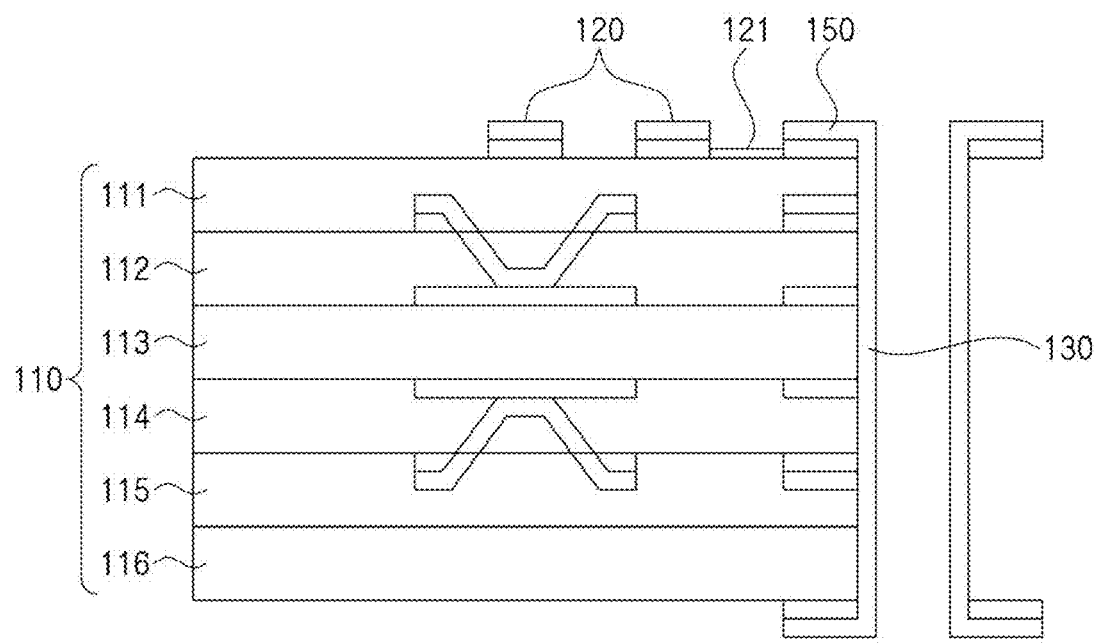
FIG. 1 is a cross-sectional view schematically showing a surface mounted device module according to an embodiment of the present invention.

110, 111, 112, 113, 114, 115, 116: Substrate
120: RF pattern
121: RF line
122: Open area
130: Side via
131: Inscribed circle of side via
140: Ground
150: Side via pad

BEST MODE FOR CARRYING OUT THE INVENTION

Hereafter, a surface mounted device module of the present invention will be described in detail with reference to the accompanying drawings. The described embodiments are provided to enable those skilled in the art to easily understand the spirit of the present invention, and the present invention is not limited thereto. In addition, the elements expressed in the accompanying drawings are schematized drawings to easily explain the embodiments of the present invention and may be different from actually implemented forms.

The description that a layer (film), region, pattern or structure of the embodiments is formed "on the top of/on" or "on the bottom of/under" a substrate, layer (film), region, pad or pattern includes forming them directly or with intervention of another layer. The criteria of the "top/on" or "bottom/under" of each layer will be described with reference to the drawings. In addition, when an element is "connected" to another element, it includes a case of 'indirectly connecting' the elements with intervention of another element therebetween, as well as a case of 'directly connecting' the elements. In addition, when an element "includes" another element, it means that the element may be specially further provided with the another element. In the drawings, since the thickness or size of a layer (film), region, pattern or structure may be modified for the clarity and convenience of explanation, it does not completely reflect a real size.

Meanwhile, the expression of 'including' a component is an expression of an 'open type' which merely refers to existence of a corresponding component, and it should not be construed as precluding additional components.

FIG. 1 is a cross-sectional view showing a surface mounted device module according to an embodiment of the present invention. Referring to FIG. 1, the surface mounted device module according to an embodiment of the present invention includes a multi-layer substrate 110, 111, 112, 113, 114, 115 and 116, an RF pattern 120 formed on the multi-layer substrate 110, 111, 112, 113, 114, 115 and 116, and a side via 130 formed on the multi-layer substrate 110, 111, 112, 113, 114, 115 and 116 to electrically connect the multi-layer substrate 110, 111, 112, 113, 114, 115 and 116, and the horizontal diameter and the vertical diameter of the side via 130 are different from each other. The surface mounted device module of the present invention forms the horizontal diameter and the vertical diameter of the side via hole 130 formed on the multi-layer substrate 110, 111, 112, 113, 114, 115 and 116 to be different from each other in order to minimize signal loss generated when a plurality of substrates in the multi-layer substrate 110, 111, 112, 113, 114, 115 and 116 is bonded to each other.

Although a conventional side via is generally formed as a circle having the same horizontal and vertical diameters, the side via 30 according to an embodiment of the present invention may be formed in the shape of a circle or any one of polygons. In addition, if the side via 30 according to an embodiment of the present invention is formed in the shape of a circle, the horizontal diameter and the vertical diameter may be formed to be different from each other, and particularly, the horizontal diameter may be formed to be longer than the vertical diameter.

In the multi-layer substrate formed of six substrates 111, 112, 113, 114, 115 and 116 as shown in FIG. 1, the substrates 111, 112, 113, 114, 115 and 116 are connected to each other through the side via 130. An RF pattern 120 is formed on each of the substrates 111, 112, 113, 114, 115 and 116. The multi-layer substrate 111, 112, 113, 114, 115 and 116 shown in FIG. 1 is an example, and any surface mounted device module formed as a multi-layer substrate in which a plurality of substrates is arranged may be applied in a variety of ways. In addition, the RF pattern 120 formed on the substrates 111, 112, 113, 114, 115 and 116 may be an RF pattern for implementing various communication methods such as Wi-Fi, BT, 3G modem, 4G modem and the like. In addition, the RF pattern 120 may be various patterns that can be applied to the surface mounted device module without being limited to the communication methods mentioned above.

Figure 2:
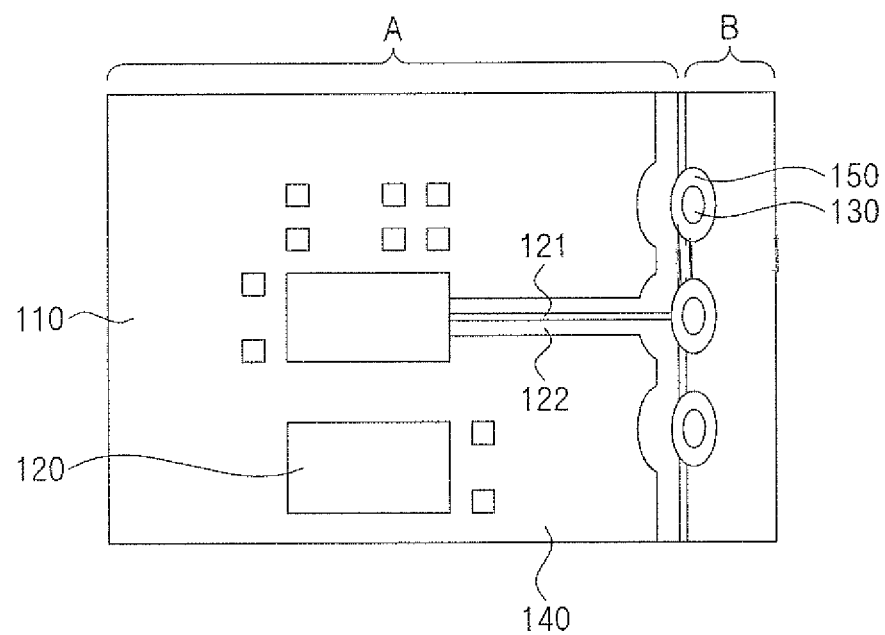
FIG. 2 is a plan view schematically showing a surface mounted device module according to an embodiment of the present invention.

FIG. 2 is a plan view showing a surface mounted device module according to an embodiment of the present invention. Referring to FIG. 2, a side via 130 according to an embodiment of the present invention is formed to have a horizontal diameter and a vertical diameter different from each other. In addition, when the side via is formed, it may be particularly formed such that the horizontal diameter is longer than the vertical diameter. At this point, the horizontal diameter refers to a diameter of a direction parallel to the outer periphery of the substrate, and the vertical diameter refers to a diameter of a direction perpendicular to the outer periphery of the substrate.

An outer area B is formed in the multi-layer substrate 110, and although the center of the side via 130 may be positioned in the inner area A of the multi-layer substrate 110 or on the boundary of the inner area A and the outer area B, the center of the side via 130 is preferably positioned in the outer area B. The position of the center of the side via 130 is set in advance before the surface mounted device module is manufactured.

If the center of the side via 130 is positioned in the outer area B, there is an effect of enhancing manufacturing throughput by lowering the bur, which is generated when the outer periphery of the substrate 110 is processed, and improving the defect rate of plating. When the center of the side via 130 is positioned in the outer area B, 80% or more of the area of the side via 130 preferably exists in the outer area B. However, a ratio of the area existing in the outer area B to the area of the side via 130 is not limited, and it may be changed by those skilled in the art if the bur, which is generated when the outer periphery of the substrate 110 is processed, and the defect rate of plating can be lowered or according to impedance matching with the RF pattern 120 formed on the substrate 110.

Generally, the side via 130 is processed as a hole in the outer periphery of the substrate 110. The side via is formed by routing the outer periphery of the substrate after plating the processed hole with lead, tin, spirifer fossil, gold or the like. A bur or a plating defect occurs on the surface of the side via 130 in the routing process. The bur is a phenomenon of uncleanly cutting and drooping since ductility of a copper film is large. An object of the present invention is lowering the bur, which is generated when the side via 130 is manufactured, and the defect rate of plating.

Figure 5A:
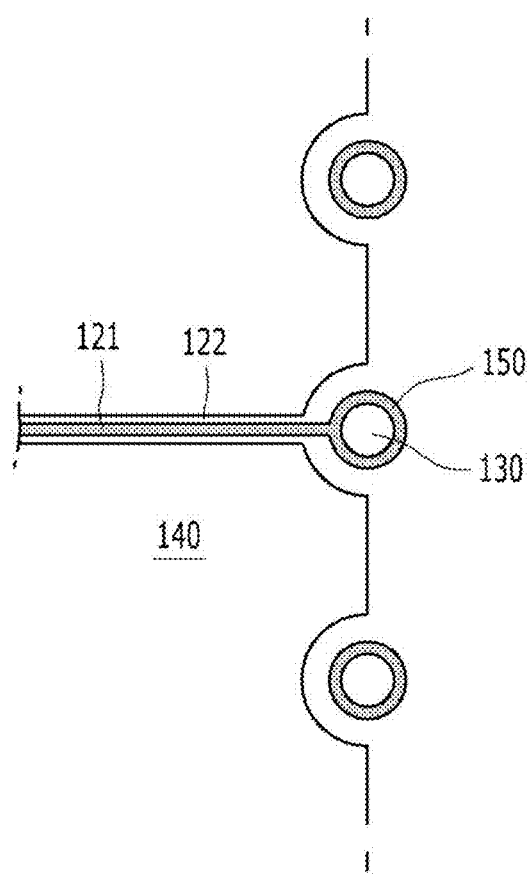

At this point, the side via 130 may be exposed to the outer periphery of the surface mounted device module in a variety of shapes, and it may be formed in at least any one of shapes including a semicircle, a semi-ellipse, a square, a rectangle and a trapezoid or may be exposed to the outer periphery of the surface mounted device module in a concave shape. In addition, the concave shape may include a curved line or at least one of two or more segments including one or more angles. Particularly, the side via of the present invention is a shape dividing semicircle-semicircle in the middle into two parts, in a shape of separating two semicircles and connecting both ends using straight lines (see FIGS. 5d, 6d and 6e).

Figure 3:
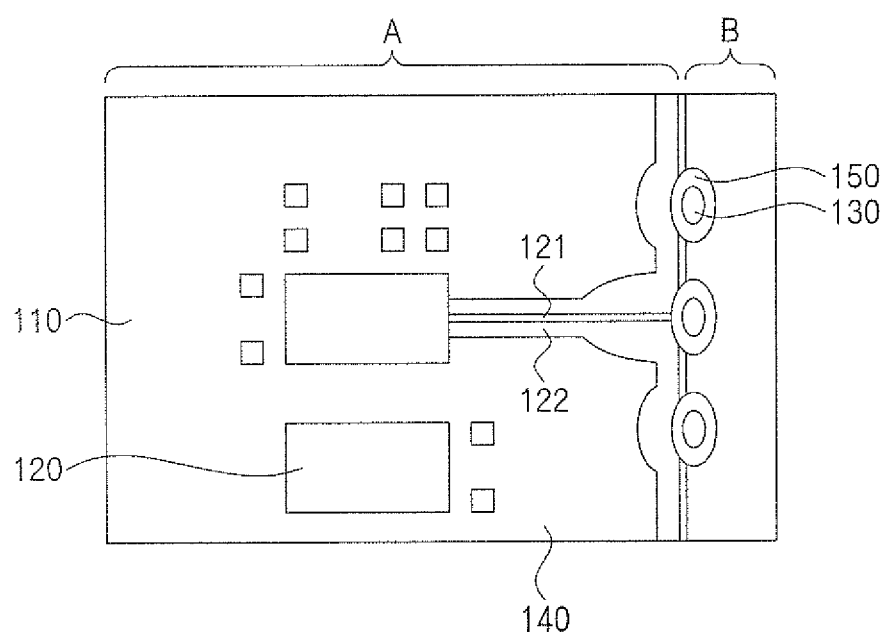
FIG. 3 is a plan view schematically showing a surface mounted device module according to another embodiment of the present invention.
Figure 4:
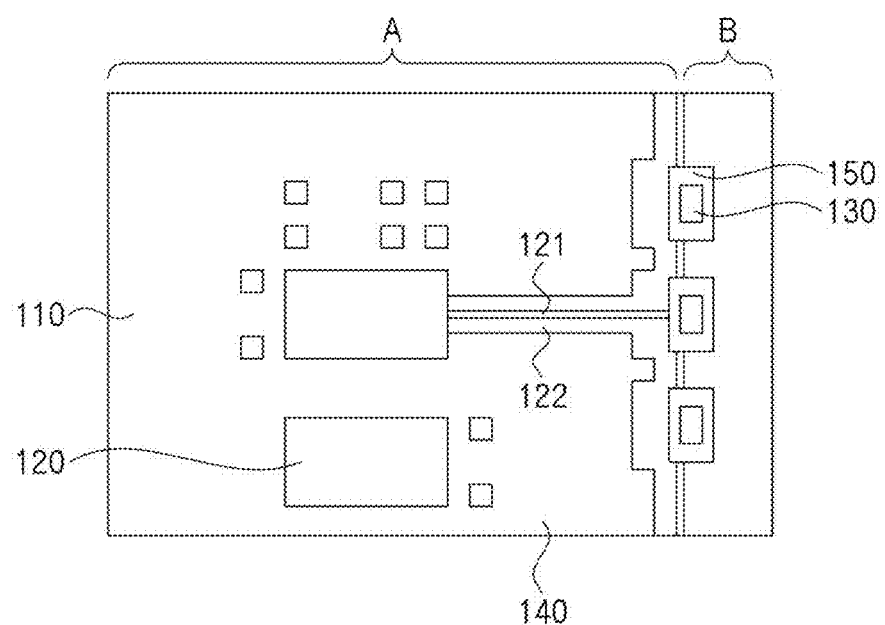
FIG. 4 is a plan view schematically showing a surface mounted device module according to still another embodiment of the present invention.

A ground 140 is formed in the surface mounted device module to be adjacent to the side via 130. The area between the side via 130 and the ground 140 is set in advance based on the area setting information. FIG. 3 is a plan view schematically showing a surface mounted device module according to another embodiment of the present invention. Although thickness of the RF pattern formed on the substrate 110 is designed by impedance calculation, a problem of mismatching the impedance generates when the RF pattern, to which a signal finally arrives, and the side via 130 are formed and connected.

Figure 5B:
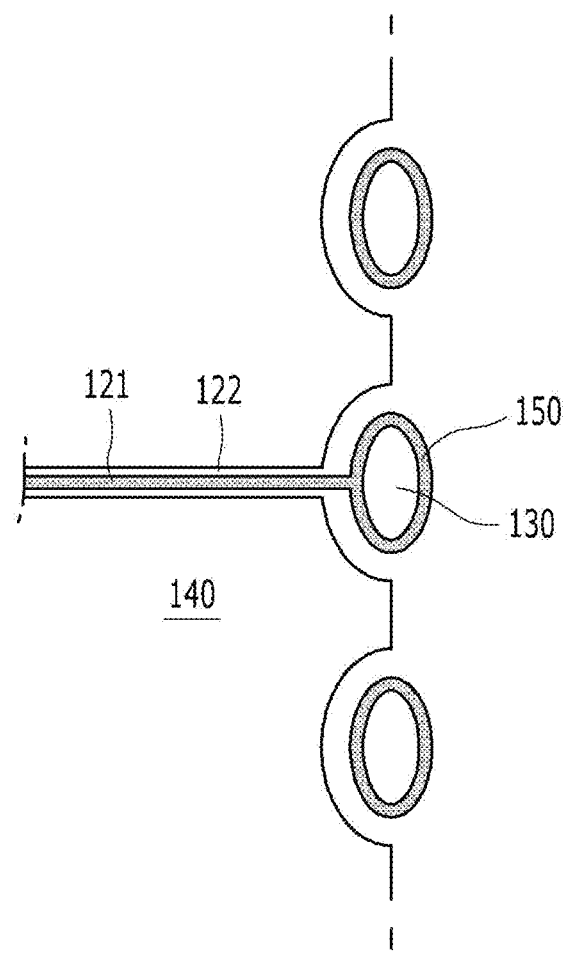
Figure 5C:
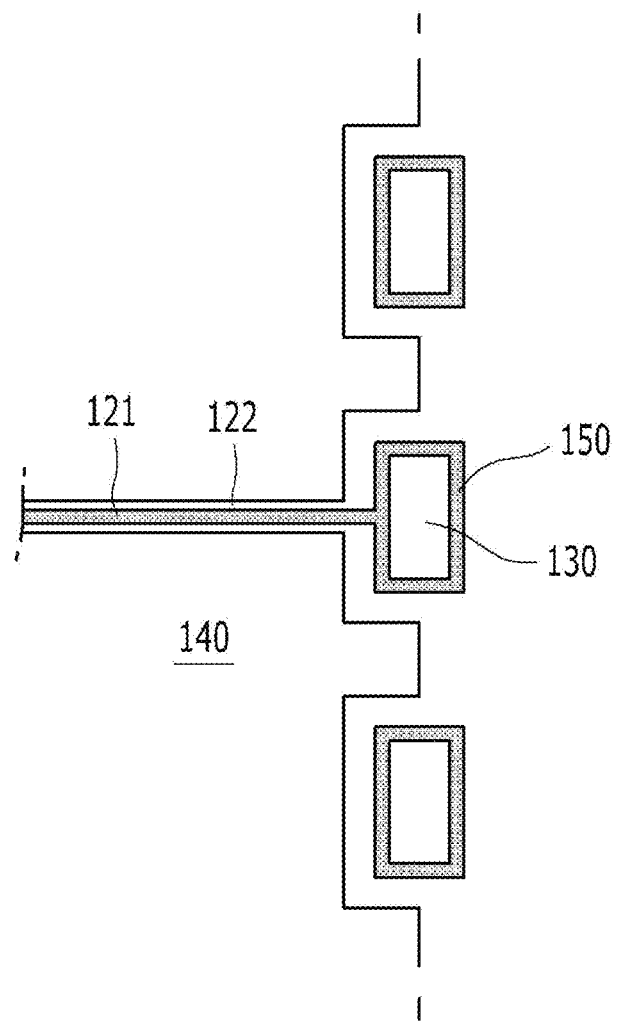

Generally, impedance matching is calculated by a characteristic between a first substrate 111, which is the top substrate, and a second substrate 112, and at this point, the side via 130 is processed to penetrate from the first substrate 111, which is the top substrate, to a sixth substrate 116, which is the bottom substrate. Therefore, the impedance is mismatched since the RF signal is affected by the substrates other than the first substrate and the second substrate after the side via 130 is formed to penetrate the substrates, and this is the main cause of loss when a signal is transferred. To solve such a problem, the impedance matching may be performed, after the side via is formed, by adjusting the distances between the side via 130, the via pad, and the ground 140. The distance to be adjusted will be described below in detail with reference to FIGS. 5a to 5c.

The RF pattern 120 is formed of an RF line 121 and an open area 122 other than the RF line, and the open area may be formed outside the side via pad. At this point, the open area may be formed outside the side via pad to be spaced by a predetermined distance in correspondence to the shape of the side via pad.

In addition, the shape of the open area may be modified slightly within an area as wide as to be formed with a predetermined distance in correspondence to the shape of the side via pad. For example, if the shape of the side via pad is a semielliptical shape and the area of the open area is 0.05 mm$^2$ when the area is spaced apart from the semi-ellipse as much as 0.1 mm, the shape of the open area may be formed in a semielliptical shape, which is a shape the same as that of the side via pad, and various shapes, such as a rectangle, a square, a trapezoid and the like, having an area as wide as 0.05 mm$^2$ may be applied.

At this point, the open area is formed to space the ground from the RF line 121 as much as a first distance d1 for impedance matching of the RF pattern and to space the ground from the side via pad as much as a second distance d2 for impedance matching of the RF pattern 120. In addition, the second distance may be set to be larger than the first distance, and the second distance may be implemented in a method of adjusting the distance from the original distance between the ground and the side via pad by removing part of the ground, and when a surface mounted device module is manufactured, the second distance may be calculated according to a formula described below, and the open area may be formed while the ground is spaced apart from the side via pad as much as the second distance.

In addition, the second distance d2 is a distance corresponding to a value determined based on the shape of the side via, which is at least any one of shapes including a semicircle, a semi-ellipse, a square, a rectangle and a trapezoid. At this point, the second distance d2 is determined by the impedance Z_RF_line associated with the RF line, the impedance Z_side_via of the side via, the thickness H of the multi-layer substrate, the permittivity Er of the multi-layer substrate, the diameter D_c of an inscribed circle of a shape including at least any one of a semicircle, a semi-ellipse, a square, a rectangle and a trapezoid, and the diameter D_p of the side via pad. A detailed formula for determining the distance according to these several variables will be described in detail in FIGS. 6a to 6e.

The side via pad 150 is positioned on at least any one layer of the multi-layer substrate and formed around the side via. At this point, the side via pad may be formed around the side via to be spaced by a predetermined distance in correspondence to the shape of the side via, and the side via pad may be formed between the side via 130 and the ground 140 to be spaced by a predetermined distance. After the side via is formed to penetrate the multi-layer substrate, a conductive material is coated on the side via in a method of plating or the like, and a plurality of side via pads 150 is formed around the side via at regular intervals. At this point, since the side via pad 150 is connected to the RF pattern formed on each substrate through a signal line, all of the RF pattern, the side via hole, and the plurality of side via pads positioned on each substrate layer are electrically connected.

When the distance between the via pad 150 and the ground 140 is adjusted, the ground may be removed to be spaced by a predetermined distance by peeling off the copper Cu formed in the ground area. The area between the side via 130 and the ground 140 is determined by the thickness of the substrate 110, the size of the side via 130, the thickness of the copper Cu inside the side via 130 and the like.

In addition, when the side via is exposed to the outer periphery of the surface mounted device module in a concave shape, the second distance d2 may be determined based on the concave shape. Details thereof will be described below.

It means that the area setting information is set based on the thickness of the substrate 110, the size of the side via 130, and the thickness of the copper Cu inside the side via 130. The RF pattern is designed considering the number of stacked substrates, permittivity of the inner dielectric, thickness and height of the formed copper Cu and the like. The design will be described below in detail with reference to FIGS. 5a to 5c.

Referring to FIGS. 3, 4, 5a, 5b, 5c and 5d, the side via 130 may be formed in at least any one of shapes including a circle, an ellipse, a square, a rectangle and a trapezoid. In addition, the side via 130 may be formed in a shape of separating two semicircles and connecting both ends using straight lines. This corresponds to the shape of a side via which may appear when the side via is formed by moving a circular drill along a straight line when the side via is formed.

In addition, impedance matching of the surface mounted device module of the present invention may vary according to the shape of the side via 130. The shape of the side via may be set in advance according to impedance matching of the surface mounted device module.

FIGS. 6a to 6e are plan views showing the configurations of adjusting the distance between the via pad and the ground of a surface mounted device module according to an embodiment of the present invention.

Figure 6A:
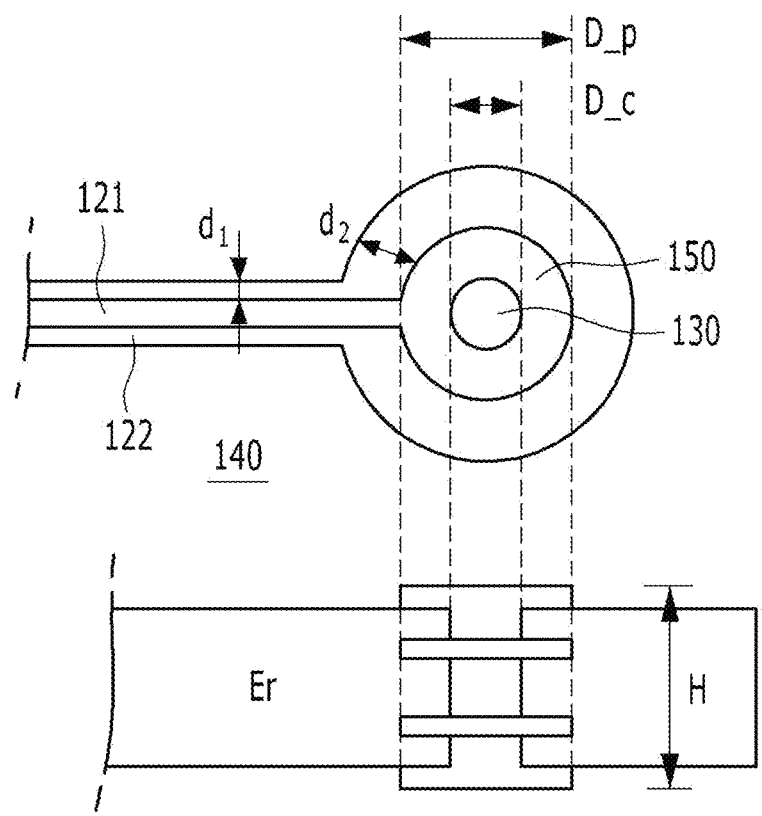
FIGS. 6a to 6e are exemplary views showing the criteria of calculating a distance for removing the ground when the ground is removed for impedance matching of a surface mounted device module of the present invention.
Figure 6B:
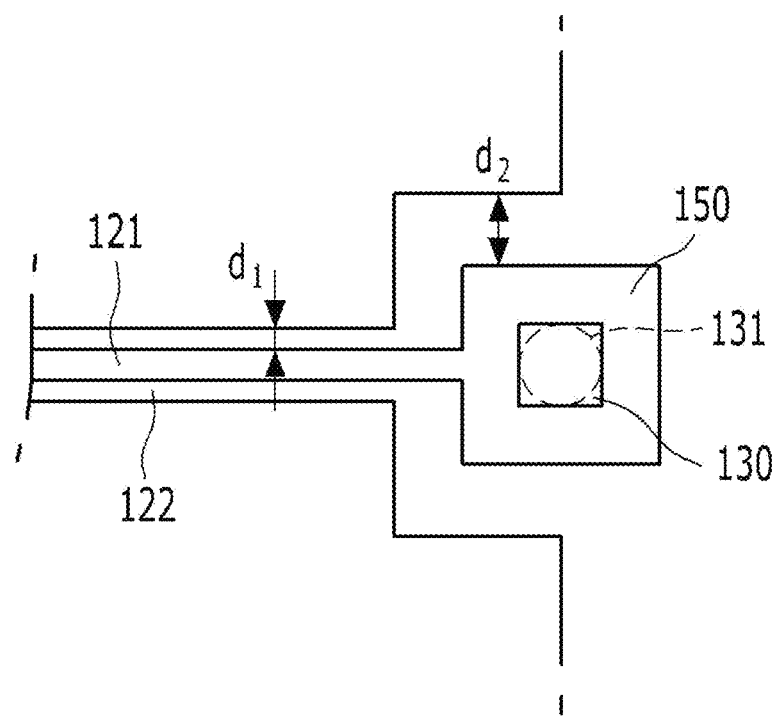
Figure 6C:
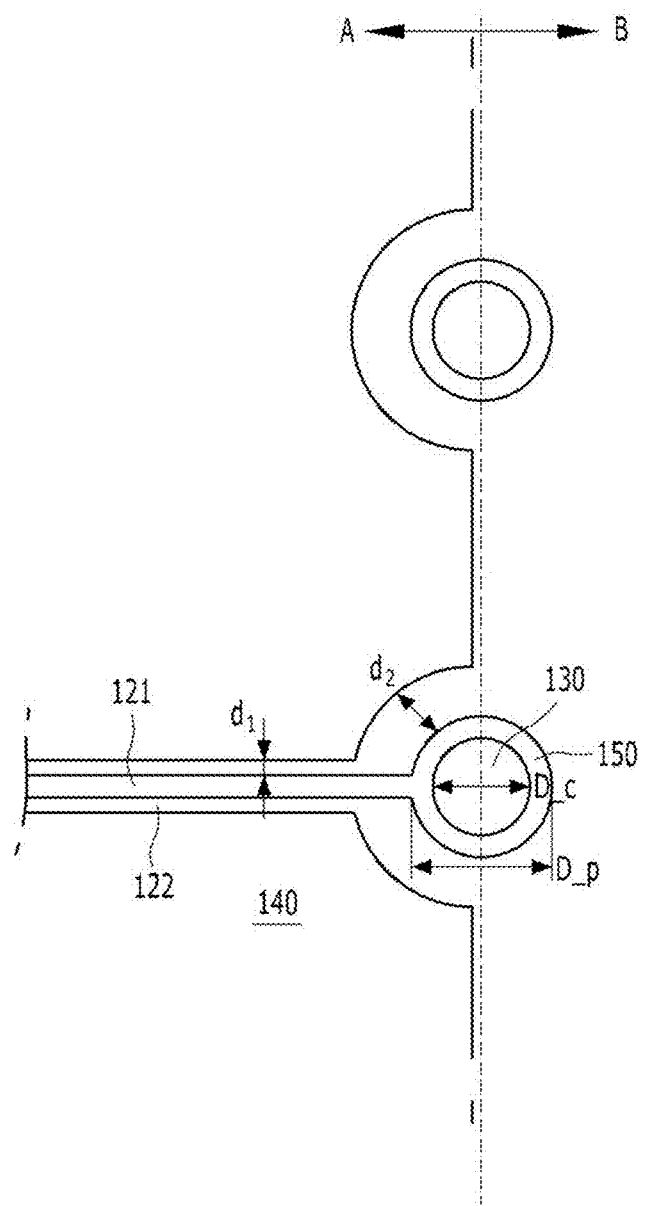

Referring to FIGS. 6a, 6b and 6c, when the side via hole is formed in a circular shape, numerical values of a module for adjusting the distance of removing the ground may be confirmed. At this point, numerical values of the first distance d1 (mm) between the ground and the RF line, the second distance d2 (mm) between the ground and the side via pad, the diameter D_c (D_inscribed_circle; mm) of an inscribed circle of a shape including at least any one of a semicircle, a semi-ellipse, a square, a rectangle and a trapezoid, the diameter D_p (D_side_via_pad; mm) of the side via pad, the thickness H of the multi-layer substrate, the permittivity Er of the multi-layer substrate, the impedance Z_RF_line (Q) associated with the RF line, the impedance Z_side_via (Q) of the side via, the inductance L (nH), and the capacitance C (pF) can be used.

At this point, the second distance may be determined according to the shape of the side via, i.e., the second distance may be determined by the diameter of the inscribed circle when the side via is in a shape including at least any one of a circle, a square and a trapezoid, by the length of the minor axis (short side) when the side via is in the shape of a semi-ellipse or a rectangle, or by the depth of the concave shape itself when the side via is in a concave shape.

First, inductance may be obtained by a formula shown below using the diameter D_c of the inscribed circle of the side via shape and the thickness H of the substrate.

$$L = \frac{H}{5}\left[\ln\left(\frac{4H}{D\_c}\right) + 1\right]$$

At this point, the diameter D_c of the inscribed circle of the side via shape refers to the diameter of a semicircle or a semi-ellipse when the shape of the side via is a semicircle or a semi-ellipse and refers to the diameter of the inscribed circle 131 of the side via 130 as shown in FIG. 6B when the shape of the side via is a square, a rectangle or a trapezoid.

Subsequently, capacitance may be obtained by a formula shown below based on the impedance to be matched.

$$Z_{side\_via} = \sqrt{\frac{L}{C}}$$

Finally, the second distance d2 between the ground and the side via pad may be obtained by a formula shown below using the permittivity Er, the thickness H of the substrate, the diameter D_p of the side via pad, and the capacitance C.

$$C = \frac{0.055 \times E_r \times H \times D\_p}{2 \times d_2}$$

For example, a side via hole of a circular shape is formed as shown in FIG. 6C, and if the diameter D_c of the inscribed circle is 0.9 mm, the diameter D_p of the side via pad is 1.2 mm, the thickness H of the substrate is 1.2 mm, the permittivity Er is 4.3, and the matching impedance Z_side_via is 50Ω, numerical values of the inductance L (nH), the capacitance C (pF) and the second distance d2 between the ground and the side via pad may be calculated as shown below.

$$L = \frac{H}{5}\left[\ln\left(\frac{4H}{D\_c}\right) + 1\right] = \frac{1.2}{5}\left[\ln\left(\frac{4.8}{0.9}\right) + 1\right] = 0.64 nH$$

$$Z_{side\_via} = 50 = \sqrt{\frac{L}{C}} = \sqrt{\frac{0.64 nH}{C}}, \quad C = 0.256 \text{ pF}$$

$$C = \frac{0.055 \times E_r \times H \times D\_p}{2 \times d_2} = \frac{0.055 \times 4.3 \times 1.2 \times 1.2}{2 \times d_2} = 0.256 \text{ pF},$$

$$d_2 = 0.65 \text{ mm}$$

Accordingly, since the second distance d2 between the side via pad and the ground becomes 0.65 mm, impedance matching of 50Ω may be performed by removing the ground as much as a distance 0.65 mm apart from the via pad.

Figure 6D:
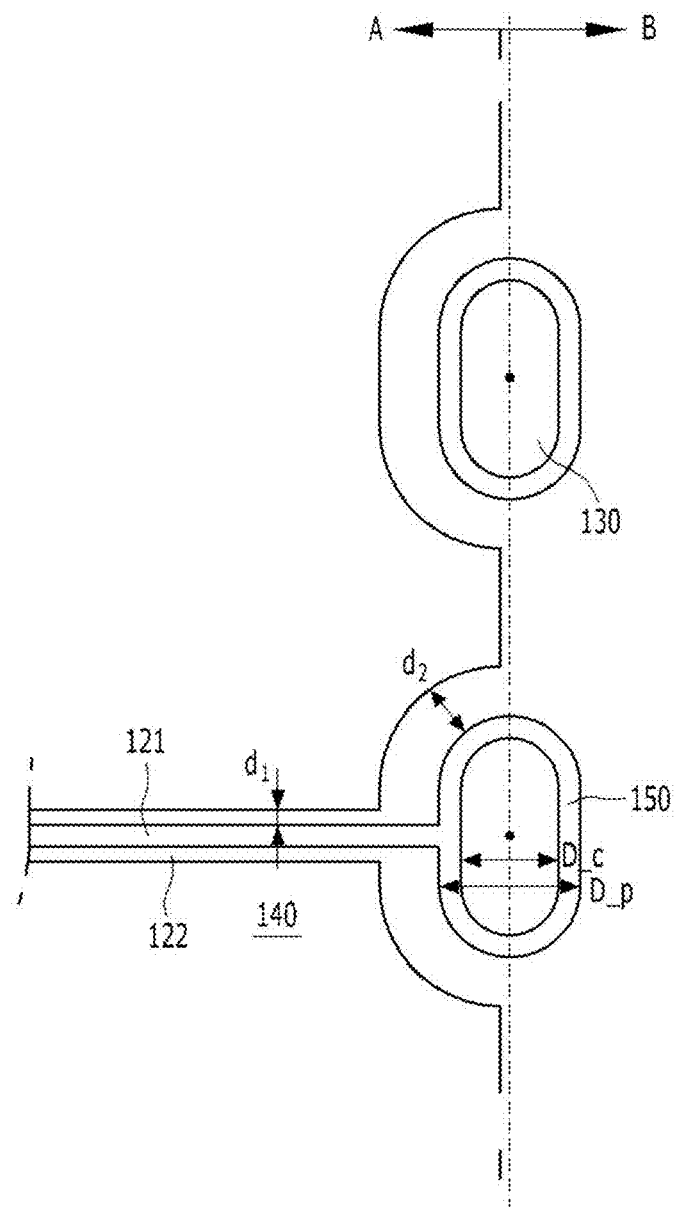

Referring to FIG. 6D, a side via hole having different horizontal and vertical diameters is formed like an ellipse or a shape formed by separating two semicircles and connecting both ends using straight lines, and if the center of the side via hole is positioned on the boundary of the inner area and the outer area, numerical values of a module for adjusting the distance of removing the ground may be confirmed. At this point, the diameter D_p (mm) of the side via pad of FIG. 5A may be calculated based on the smaller diameter of the ellipse.

For example, a side via hole of an elliptical shape is formed as shown in FIG. 6D, and the diameters of the side via hole are 0.4 mm and 0.9 mm, respectively, and if the diameter D_c of the inscribed circle is 0.4 mm, the diameter D_p of the side via pad is 0.6 mm, the thickness H of the substrate is 1.2 mm, the permittivity Er is 4.3, and the matching impedance Z_side_via is 50Ω, numerical values of the inductance L (nH), the capacitance C (pF) and the second distance d2 between the ground and the side via pad may be calculated as shown below.

$$L = \frac{H}{5}\left[\ln\left(\frac{4H}{D\_c}\right) + 1\right] = \frac{1.2}{5}\left[\ln\left(\frac{4.8}{0.4}\right) + 1\right] = 0.836 nH$$

$$Z_{side\_via} = 50 = \sqrt{\frac{L}{C}} = \sqrt{\frac{0.836 nH}{C}}, \quad C = 0.330 \text{ pF}$$

$$C = \frac{0.055 \times E_r \times H \times D\_p}{2 \times d_2} = \frac{0.055 \times 4.3 \times 1.2 \times 0.6}{2 \times d_2} = 0.330 \text{ pF},$$

$$d_2 = 0.3 \text{ mm}$$

Accordingly, since the second distance d2 between the side via pad and the ground becomes 0.3 mm, impedance matching of 50Ω may be performed by removing the ground as much as a distance 0.3 mm apart from the via pad.

Figure 6E:
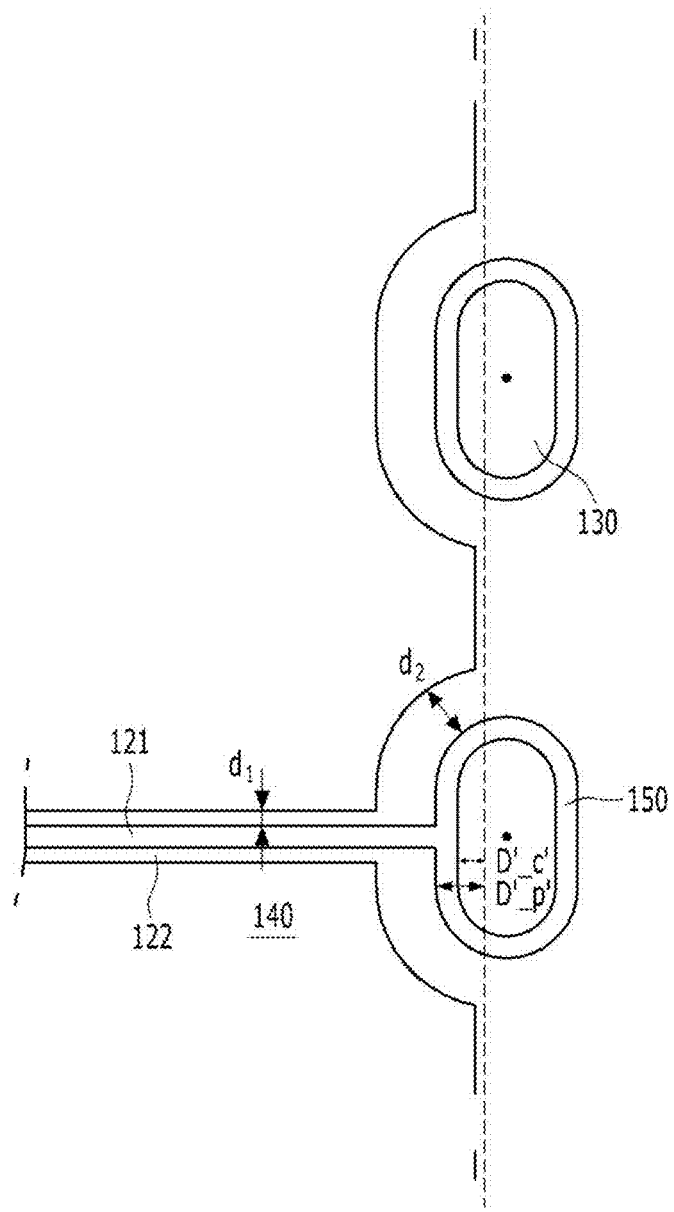
Figure 7:
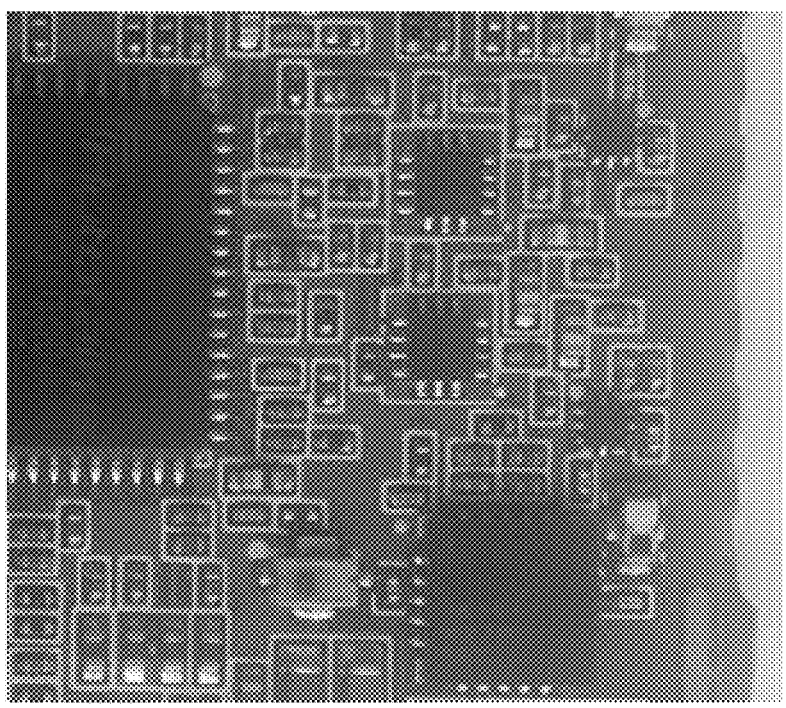
FIG. 7 shows a picture of a surface mounted device module according to an embodiment of the present invention.

Referring to FIG. 6E, a side via having different horizontal and vertical diameters is formed like an ellipse or a shape formed by separating two semicircles and connecting both ends using straight lines, and if the center of the side via is positioned in the outer area, numerical values of a module for adjusting the distance of removing the ground may be confirmed. At this point, the diameter D_c (mm) of the inscribed circle of FIG. 6A is calculated based on a value obtained by subtracting a distance of moving the center from the smaller diameter.

At this point, if the center of the via has moved as much as 0.1 mm, since the semidiameter is reduced as much as 0.1 mm from 0.2 mm in the formula, the corrected smaller semidiameter D_c' becomes 0.1 mm, and 0.2 mm may substitute for the diameter in the formula. In the same manner, since the semidiameter of 0.3 mm of the via pad also becomes 0.2 mm after correcting the semidiameter D_p', 0.4 mm may substitute for the diameter of in the formula.

For example, a side via of an elliptical shape is formed as shown in FIG. 6D, and the diameters of the side via are 0.4 mm and 0.9 mm, respectively, and if the diameter D_c' of the via pad is 0.6 mm, the thickness H of the substrate is 1.2 mm, the permittivity Er is 4.3, the matching impedance Z0 is 50Ω, and the diameter of the side via has moved from the center as much as 0.1 mm, numerical values of the inductance L (nH), the capacitance C (pF) and the diameter D2 removing the ground may be calculated as shown below.

$$L = \frac{H}{5}\left[\ln\left(\frac{4H}{D\_c}\right) + 1\right] = \frac{1.2}{5}\left[\ln\left(\frac{4.8}{0.2}\right) + 1\right] = 1.1691 nH$$

$$Z_{side\_via} = 50 = \sqrt{\frac{L}{C}} = \sqrt{\frac{1.1691 nH}{C}}, \quad C = 0.477 \text{ pF}$$

-continued $$C = \frac{0.055 \times E_r \times H \times D\_p}{2 \times d_2} = \frac{0.055 \times 4.3 \times 1.2 \times 0.4}{2 \times d_2} = 0.477 \text{ pF},$$

$$d_2 = 0.12 \text{ mm}$$

Accordingly, since the second distance d2 between the side via pad and the ground becomes 0.12 mm, impedance matching of 50Ω may be performed by removing the ground as much as a distance 0.12 mm apart from the via pad.

In addition, when an open area is formed around the side via pad by removing the ground of the present invention, the open area may be formed on the top layer and the bottom layer of the multi-layer substrate. For example, when the multi-layer substrate is formed of a first substrate to a sixth substrate, a ground and a side via hole are formed on each of the substrates, and proper impedance matching may be derived by removing only the grounds of the top layer and the bottom layer.

As is confirmed from FIGS. 6a to 6e, since the distance of removing the ground for impedance matching becomes shorter if the via hole is configured in a further elongated elliptical shape and the center of the via hole is positioned in a farther outer periphery of the PCB substrate, unnecessary removal of the ground can be reduced.

The embodiments of the present invention have been disclosed for illustrative purposes, and it is to be appreciated that even the parts that can be changed, modified or added by those skilled in the art within the scope and spirit of the present invention fall within the claims of the present invention.

The invention claimed is:

1. A surface mounted device module comprising:
a multi-layer substrate;
a side via formed to penetrate the multi-layer substrate and electrically connect the multi-layer substrate;
a side via pad positioned on at least any one layer of the multi-layer substrate and formed around the side via; and
an RF pattern connected to the side via pad by a signal line, wherein
all of the RF pattern, the side via, and the side via pad are electrically connected,
the side via is exposed to an outer periphery of the surface mounted device module in a concave shape,
the side via pad is provided at the outer periphery of the surface mounted device module, and the side via is provided within the side via pad, and
wherein the side via extends in a first direction that is parallel to the outer periphery of the surface mounted device module, and the side via extends in a second direction that is perpendicular to the outer periphery of the surface mounted device module, and a half-distance of the side via in the first direction is longer than a largest distance of the side via in the second direction.

2. The module according to claim 1, wherein the side via pad is formed around the side via to be spaced by a predetermined distance in correspondence to a shape of the side via.

3. The module according to claim 1, wherein the concave shape of the side via includes a curved line or at least one of two or more segments including one or more angles.

4. The module according to claim 1, wherein the RF pattern is formed of an RF line and an open area other than the RF line, and the open area is formed outside the side via pad in correspondence to a shape of the side via pad, wherein a ground is spaced apart from the side via pad by a distance d2 for impedance matching of the RF pattern.

5. The module according to claim 4, wherein the open area includes an area spaced by the distance d2 from the side via pad to the ground.

6. The module according to claim 4, wherein the distance d2 is a distance corresponding to a value determined based on at least one of a semi-ellipse, a rectangle or a trapezoid.

7. The module according to claim 4, wherein the distance d2 is determined based on the concave shape.

8. The module according to claim 4, wherein the distance d2 is determined based on impedance Z_RF_line associated with the RF line, impedance Z_side_via of the side via, thickness H of the multi-layer substrate, permittivity Er of the multi-layer substrate, a length D_c of a minor axis when the side via is in a shape of a semi-ellipse or a rectangle, and a diameter D_p of the side via pad.

9. The module according to claim 4, wherein the distance d2 is determined based on impedance Z_RF_line associated with the RF line, impedance Z_side_via of the side via, thickness H of the multi-layer substrate, permittivity Er of the multi-layer substrate, a depth D_c of a concave shape in case of a side via of the concave shape, and a diameter D_p of the side via pad.

10. The module according to claim 4, wherein impedance Z_side_via of the side via is determined based on the following formulas:

$$L = \frac{H}{5}\left[\ln\left(\frac{4H}{D\_c}\right) + 1\right]$$

$$Z_{side\_via} = \sqrt{\frac{L}{C}}$$

$$C = \frac{0.055 \times E_r \times H \times D\_p}{2 \times d_2},$$

wherein H is a thickness of the multi-layer substrate, Er is a permittivity of the multi-layer substrate, D_c is a length of a minor axis when the side via is in a shape of a semi-ellipse or a rectangle, and D_p is a diameter of the side via pad.

11. The module according to claim 4, wherein an area formed around the side via pad in the open area is formed on a top layer and a bottom layer of the multi-layer substrate.

12. The module according to claim 9, wherein the impedance Z_RF_line associated with the RF line and the impedance Z_side_via of the side via satisfy a condition of having an approximate value, and the impedance Z_side_via of the side via is determined based on the following formulas:

$$L = \frac{H}{5}\left[\ln\left(\frac{4H}{D\_c}\right) + 1\right]$$

$$Z_{side\_via} = \sqrt{\frac{L}{C}}$$

$$C = \frac{0.055 \times E_r \times H \times D\_p}{2 \times d_2},$$

wherein H is a thickness of the multi-layer substrate, Er is a permittivity of the multi-layer substrate, D_c is a length of a minor axis when the side via is in a shape of a semi-ellipse or a rectangle, and D_p is a diameter of the side via pad.

* * * * *